(12) United States Patent
Kim

(10) Patent No.: US 11,494,093 B2
(45) Date of Patent: Nov. 8, 2022

(54) METHOD AND APPARATUS FOR PROCESSING DATA OF IN-MEMORY DATABASE

(71) Applicant: ARMIQ Co., Ltd., Seoul (KR)

(72) Inventor: Oxoo Kim, Seoul (KR)

(73) Assignee: ARMIQ CO., LTD., Seoul (KR)

( * ) Notice: Subject to any disclaimer, the term of this patent is extended or adjusted under 35 U.S.C. 154(b) by 0 days.

(21) Appl. No.: 17/076,119

(22) Filed: Oct. 21, 2020

(65) Prior Publication Data
US 2022/0066656 A1    Mar. 3, 2022

(30) Foreign Application Priority Data

Aug. 27, 2020    (KR) .................. 10-2020-0108749

(51) Int. Cl.
*G06F 3/06*    (2006.01)
(52) U.S. Cl.
CPC .......... *G06F 3/0622* (2013.01); *G06F 3/0655* (2013.01); *G06F 3/0679* (2013.01)
(58) Field of Classification Search
None
See application file for complete search history.

(56) References Cited

U.S. PATENT DOCUMENTS

| | | | | |
|---|---|---|---|---|
| 2013/0013606 A1* | 1/2013 | Stanfill | ............... | G06F 16/2322 707/737 |
| 2015/0363271 A1* | 12/2015 | Haustein | ............. | G06F 11/1464 707/682 |
| 2019/0034466 A1* | 1/2019 | Kim | ........................ | G06F 16/21 |
| 2020/0159627 A1* | 5/2020 | Bedadala | ............ | G06F 11/1464 |

FOREIGN PATENT DOCUMENTS

KR    10-2014-0072929    6/2014

* cited by examiner

*Primary Examiner* — Edward J Dudek, Jr.
*Assistant Examiner* — Jonah C Krieger
(74) *Attorney, Agent, or Firm* — Nixon Peabody LLP

(57) ABSTRACT

Provided are a data processing method and apparatus capable of rapidly searching for data compressed and stored in non-volatile storage means by compressing a data record, stored in a volatile in-memory database, in a partition unit, storing the compressed data record in the non-volatile storage means, and storing, in a table of the volatile in-memory database, a storage key to uniquely identify each of partitions stored in the non-volatile storage means and sorting information used to determine a partition for a data record.

10 Claims, 17 Drawing Sheets

FIG. 8

| PERIOD | OBJECT ID |
|---|---|
| 2002.01 | O0001 |
| 2002.02 | O0002 |
| 2002.03 | O0003 |

FIG. 9

| Col1 | OBJECT ID |
|------|-----------|
| 1000 | O0001 |
| 2000 | O0002 |

910 — Col1
920 — OBJECT ID
900

FIG. 11

| PERIOD | Col1 | OBJECT ID |
|---|---|---|
| 2002.01 | 1000 | O0001 |
| 2002.01 | 2000 | O0002 |
| 2002.02 | 1000 | O0003 |
| 2002.02 | 2000 | O0004 |
| 2002.03 | 1000 | O0005 |
| 2002.03 | 2000 | O0006 |

METHOD AND APPARATUS FOR PROCESSING DATA OF IN-MEMORY DATABASE

CROSS REFERENCE TO RELATED APPLICATION

This application claims priority under 35 U.S.C. § 119 to Korean Patent Application No. 10-2020-0108749 filed on Aug. 27, 2020, which is incorporated herein by reference in its entirety.

BACKGROUND OF THE INVENTION

1. Technical Field

The following description relates to a method and apparatus for processing data of an in-memory database.

2. Description of the Related Art

As data production and consumption means, such as PCs, laptops and smartphone, are widely supplied in addition to the expansion of the supply of the Internet and the development of the data communication technology, the amount of data that is today produced and consumed increases in geometrical progression.

In order to effectively classify and use such data, a method of managing data using a database is widely used in a variety of types of companies, organizations, and schools. However, as the amount of data increases in geometrical progression, the capacity of a database will soon reach the limit. To continuously expand the capacity of the database is practically limited in terms of expenses and management.

Accordingly, there is an increasing interest in a technique capable of the capacity by efficiently archiving a database. In particular, there emerges an interest in the archiving of a database using a data compression technology and search for archived data.

A case where important data is stored in volatile data storage means having a high danger of a data loss when an obstacle occurs in the important data due to the appearance of an in-memory database technology is gradually increased. Accordingly, if data within such an in-memory database is archived in non-volatile data storage means rapidly and safely at proper storage expenses, a danger of a loss of data within such volatile data storage means can be minimized.

PRIOR ART DOCUMENT

Korean Patent Application Publication No. 10-2014-0072929 (Jun. 16, 2014) entitled "Automated Method for Performing Archiving Process"

SUMMARY OF THE INVENTION

Embodiments may provide a data processing method and apparatus capable of rapidly searching for data compressed and stored in non-volatile storage means by compressing a data record, stored in a volatile in-memory database, in a partition unit, storing the compressed data record in the non-volatile storage means, and storing, in a table of the volatile in-memory database, a storage key to uniquely identify each of partitions stored in the non-volatile storage means and sorting information used to determine a partition for a data record.

In an aspect, there is provided a data processing method performed by a computer device including at least one processor, the data processing method including determining, by the at least one processor, a partition for a data record, included in a table of a volatile in-memory database, based on sorting information of the data record, generating, by the at least one processor, a compression partition by compressing the data record for each partition, associating and storing, by the at least one processor, the compression partition and a storage key to uniquely identify the compression partition in non-volatile storage means, and associating and storing, by the at least one processor, the storage key and the sorting information in an index table of the volatile in-memory database.

According to an aspect, the sorting information may include a given field value of a corresponding data record. Storing the storage key and the sorting information in the index table may include associating and storing the storage key and the given field value in a group index table.

According to another aspect, the sorting information may include information on time of a corresponding data record. Storing the storage key and the sorting information in the index table may include associating and storing the storage key and the information on time in a period index table.

According to still another aspect, the data processing method may further include associating and storing, in a key index table, a primary key, key index information which is a location of a corresponding data record in a compression partition compressed to include the corresponding data record, and a storage key corresponding to the compression partition compressed to include the corresponding data record, with respect to each of data records included in the table.

According to still another aspect, storing the primary key, the key index information, and the storage key in the key index table may include, with respect to a second compression partition generated by compressing a data record in a connection table connected to the table through the primary key, searching for a data record having a primary key identical with the primary key of the data record included in the table, among data records included in the second compression partition, and further storing subindex information, which is a location of the retrieved data record in the second compression partition, in the data record having the same primary key in the key index table.

According to still another aspect, the data processing method may further include deleting the compressed data record from the table.

According to still another aspect, the data processing method may further include searching the index table for a storage key associated with identification information included in a restoration request in response to the restoration request for the deleted data record, searching the non-volatile storage means for a compression partition associated with the retrieved storage key, restoring the deleted data record by decompressing the retrieved compression partition, and recording the restored data record on the table based on the identification information.

According to still another aspect, generating the compression partition may include generating the compression partition by compressing, into a binary object, a data record included in the determined partition.

According to still another aspect, storing the compression partition and the storage key in the non-volatile storage means may include separately storing the compression partition and the storage key in non-volatile storage means of another computer device connected to the computer device over a network.

In an aspect, there is provided a data processing method performed by a computer device including at least one processor, the data processing method including receiving, by the at least one processor, a search condition including sorting information of a data record, searching, by the at least one processor, for a storage key associated with the sorting information included in the search condition, an index table in which sorting information of a data record and a storage key to uniquely identify a compression partition comprising a corresponding data record are associated and stored in a volatile in-memory database, and searching, by the at least one processor, for a compression partition associated with the retrieved storage key, non-volatile storage means in which a storage key and a compression partition are associated and stored.

According to an aspect, the sorting information may include a given field value of a corresponding data record. Searching for the storage key may include searching, for the storage key associated with the given field value included as the sorting information of the search condition, a group index table in which the storage key and the given field value are associated and stored.

According to another aspect, the sorting information may include information on time of a corresponding data record. Searching for the compression partition associated with the retrieved storage key may include searching, for the storage key associated with the information on time included as the sorting information of the search condition, a period index table in which the storage key and the information on time are associated and stored.

According to still another aspect, the data processing method may further include searching a key index table for key index information and a storage key, which are associated with a primary key further included in the search condition, if the search condition may further include the primary key of a data record. The key index table may associate and store a primary key, key index information which is a location of a corresponding data record in a compression partition compressed to include the corresponding data record, and a storage key corresponding to the compression partition compressed to include the corresponding data record, with each of data records included in a given table on the volatile in-memory database.

According to still another aspect, searching for the compression partition associated with the retrieved storage key may include further searching the retrieved compression partition for a data record according to the search condition based on the retrieved key index information and storage key.

According to still another aspect, when a connection table connected to the given table through the primary key is present, a key index table may further include subindex information which is a location of a data record within a second compression partition generated by compressing the data record in the connection table. Searching for the key index information and the storage key may include further searching the key index table for the subindex information associated with the primary key further included in the search condition. Searching for the compression partition associated with the retrieved storage key may include further searching the second compression partition for a data record according to the search condition based on the second compression partition and the subindex information.

According to still another aspect, the non-volatile storage means may include non-volatile storage means of another computer device connected to the computer device over a network. Searching the non-volatile storage means for the compression partition associated with the retrieved storage key may include searching the non-volatile storage means of the another computer device for the compression partition associated with the retrieved storage key over the network.

There is provided a computer program stored in a computer-readable recording medium in order to execute the method in a computer device in association with the computer device.

There is provided a computer-readable recording medium in which a program for executing the method in a computer device is written.

In an aspect, there is provided a computer device including at least one processor implemented to execute a computer-readable instruction, wherein the at least one processor determines a partition for a data record, included in a table of a volatile in-memory database, based on sorting information of the data record, generates a compression partition by compressing the data record for each partition, associates and stores the compression partition and a storage key to uniquely identify the compression partition in non-volatile storage means, and associates and stores the storage key and the sorting information in an index table of the volatile in-memory database.

In an aspect, there is provided a computer device including at least one processor implemented to execute a computer-readable instruction, wherein the at least one processor receives a search condition including sorting information of a data record, searches, for a storage key associated with the sorting information included in the search condition, an index table in which sorting information of a data record and a storage key to uniquely identify a compression partition including a corresponding data record are associated and stored in a volatile in-memory database, and searches, for a compression partition associated with the retrieved storage key, non-volatile storage means in which a storage key and a compression partition are associated and stored.

BRIEF DESCRIPTION OF THE DRAWINGS

FIG. 8 is a diagram illustrating an example of the structure of a period index table according to an embodiment of the present disclosure.

FIG. 9 is a diagram illustrating an example of the structure of a group index table according to an embodiment of the present disclosure.

FIG. 11 is a diagram illustrating an example of the structure of an index table having a form in which the period index table and the group index table are combined in an embodiment of the present disclosure.

DETAILED DESCRIPTION

Figure 1:
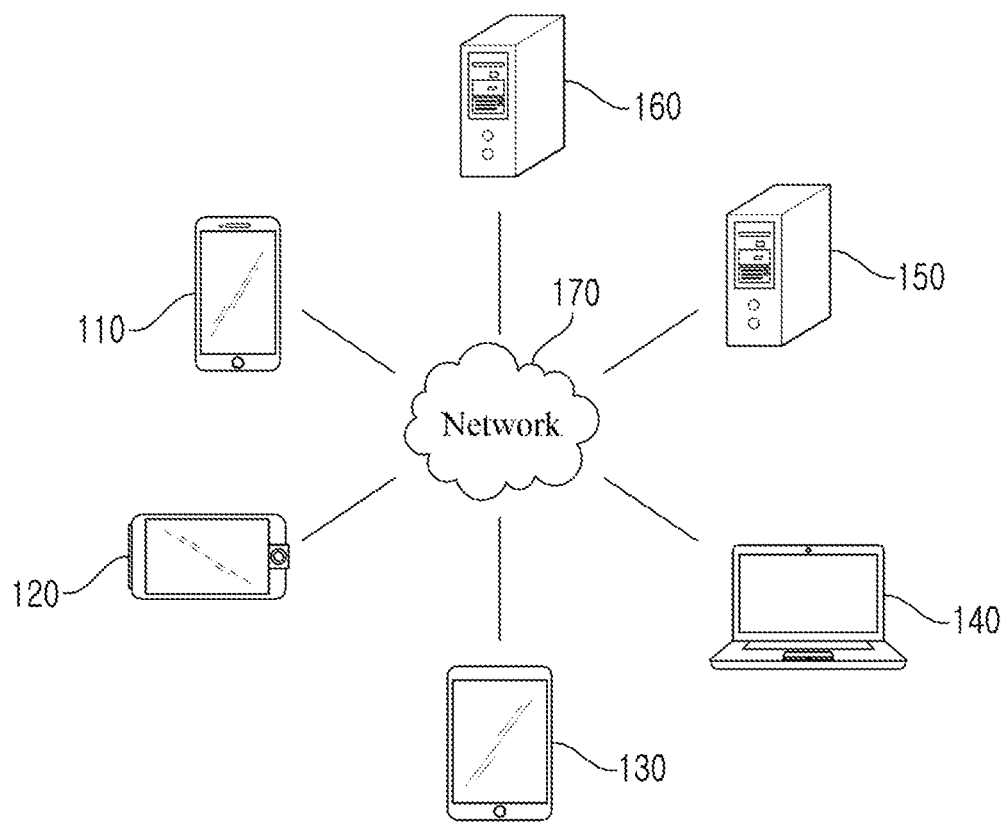
FIG. 1 is a diagram illustrating an example of a network environment according to an embodiment of the present disclosure.

The present disclosure may be changed in various ways and may have various embodiments, and specific embodiments are illustrated in the drawings and described in detail. It is however to be understood that the present disclosure is not intended to be limited to the specific disclosure and that the present disclosure includes all changes, equivalents and substitutions which fall within the spirit and technological scope of the present disclosure. In the drawings, similar elements are assigned similar reference numerals.

Terms, such as a first, a second, A, and B, may be used to describe various elements, but the elements should not be restricted by the terms. The terms are used to only distinguish one element from the other element. For example, a first element may be named a second element without departing from the scope of rights of the present disclosure. Likewise, a second element may be named a first element. The term "and/or" includes a combination of a plurality of related and illustrated items or any one of a plurality of related and described items.

When it is said that one element is "connected" or "coupled" to the other element, it should be understood that one element may be directly connected or coupled" to the other element, but a third element may exist between the two elements. In contrast, when it is described that one element is "directly connected" or "directly coupled" to the other element, it should be understood that a third element does not exist between the two elements.

The terms used in this application are used to only describe specific embodiments and are not intended to restrict the present disclosure. An expression of the singular number should be construed as including an expression of the plural number unless clearly defined otherwise in the context. It is to be understood that in this application, a term, such as "include (or comprise)" or "have", is intended to designate that a characteristic, number, step, operation, element or part which is described in the specification or a combination of them are present and does not exclude the existence or possible addition of one or more other characteristics, numbers, steps, operations, elements, parts or combinations of them in advance.

All the terms used herein, including technical terms or scientific terms unless defined otherwise in the specification, have the same meanings as those commonly understood by a person having ordinary skill in the art to which the present disclosure pertains. Terms, such as those commonly used and defined in dictionaries, should be construed as having the same meanings as those in the context of a related technology, and should not be construed as having ideal or excessively formal meanings unless explicitly defined otherwise in the specification.

Hereinafter, embodiments are described in detail with reference to the accompanying drawings.

A data processing system according to embodiments of the present disclosure may be implemented by at least one computer device. A data processing method according to embodiments of the present disclosure may be performed through at least one computer device included in the data processing system. A computer program according to an embodiment of the present disclosure may be installed and driven in the computer device. The computer device may perform the data processing method according to embodiments of the present disclosure under the control of the driven computer program. The computer program may be stored in a computer-readable recording medium in order to execute the data processing method in the computer device in association with the computer device.

FIG. 1 is a diagram illustrating an example of a network environment according to an embodiment of the present disclosure. The network environment of FIG. 1 illustrates an example including a plurality of electronic devices 110, 120, 130, and 140, a plurality of servers 150 and 160, and a network 170. FIG. 1 is an example for a description of an invention, and the number of electronic devices or the number of servers is not limited to FIG. 1. Furthermore, the network environment of FIG. 1 merely describes one of environments which may be applied to the present embodiments, and an environment which may be applied to the present embodiments is not limited to the network environment of FIG. 1.

The plurality of electronic devices 110, 120, 130 and 140 may be stationary devices or mobile devices implemented as computer devices. The plurality of electronic devices 110, 120, 130 and 140 may include a smartphone, a mobile phone, a navigation device, a computer, a laptop computer, a device for digital broadcasting, personal digital assistants (PDA), a portable multimedia player (PMP), and a tablet PC, for example. For example, in FIG. 1, a shape of a smartphone is illustrated as being an example of the electronic device 110. However, in embodiments of the present disclosure, the electronic device 110 may mean one of various physical computer devices capable of communicating with other electronic devices 120, 130 and 140 and/or the servers 150 and 160 over the network 170 substantially using a wireless or wired communication method.

The communication method is not limited, and may include short-distance wireless communication between devices in addition to communication methods using communication networks (e.g., a mobile communication network, wired Internet, wireless Internet and a broadcasting network) which may be included in the network 170. For example, the network 170 may include one or more given networks of a personal area network (PAN), a local area network (LAN), a campus area network (CAN), a metropolitan area network (MAN), a wide area network (WAN), a broadband network (BBN), and the Internet. Furthermore, the network 170 may include one or more of network topologies, including a bus network, a star network, a ring network, a mesh network, a star-bus network, and a tree or hierarchical network, but is not limited thereto.

Each of the servers 150 and 160 may be implemented as a computer device or a plurality of computer devices, which provides an instruction, a code, a file, content, or a service through communication with the plurality of electronic devices 110, 120, 130 and 140 over the network 170. For example, the server 150 may be a system that provides a service (e.g., an archiving service, a file distribution service, a map service, a content provision service, a group call service (or a voice conference service), a messaging service, a mail service, a social network service, a translation service, a financial service, a payment service, and a search service).

Figure 2:
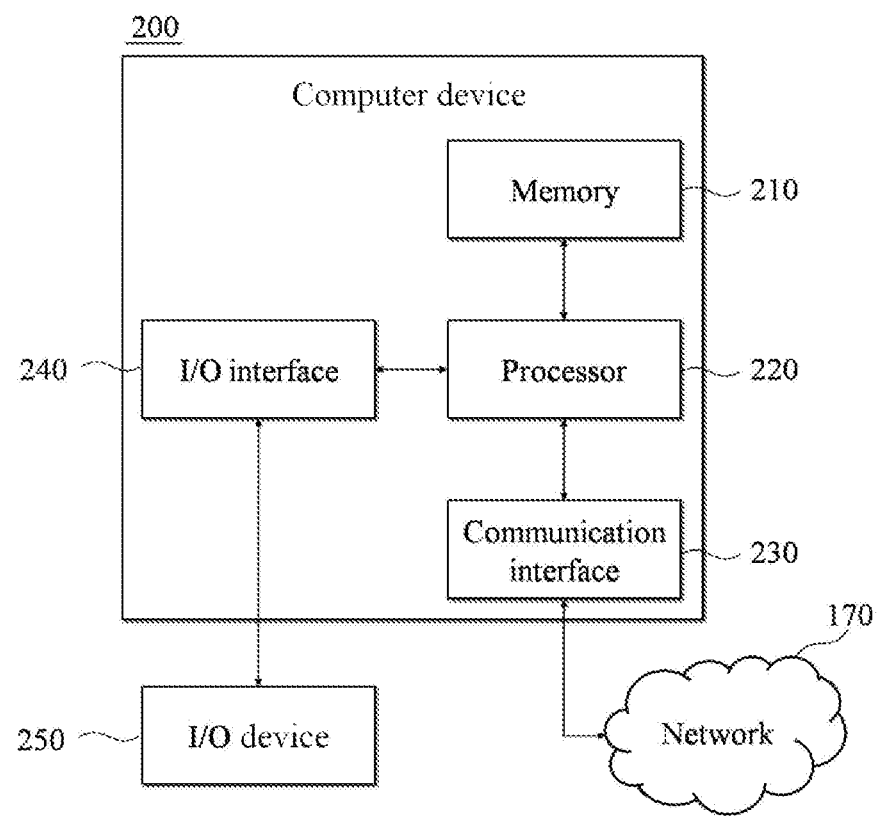
FIG. 2 is a block diagram illustrating an example of a computer device according to an embodiment of the present disclosure.

FIG. 2 is a block diagram illustrating an example of a computer device according to an embodiment of the present disclosure. Each of the plurality of electronic devices 110, 120, 130 and 140 or each of the servers 150 and 160 may be implemented by a computer device 200 illustrated in FIG. 2.

As illustrated in FIG. 2, the computer device 200 may include a memory 210, a processor 220, a communication interface 230, and an input/output (I/O) interface 240. The memory 210 is a computer-readable recording medium, and may include permanent mass storage devices, such as a random access memory (RAM), a read only memory (ROM) and a disk drive. In this case, the permanent mass storage device, such as a ROM and a disk drive, may be included in the computer device 200 as a permanent storage device separated from the memory 210. Furthermore, an operating system and at least one program code may be stored in the memory 210. Such software elements may be loaded from a computer-readable recording medium, separated from the memory 210, to the memory 210. Such a separate computer-readable recording medium may include computer-readable recording media, such as a floppy drive, a disk, a tape, a DVD/CD-ROM drive, and a memory card. In another embodiment, software elements may be loaded onto the memory 210 through the communication interface 230 not a computer-readable recording medium. For example, the software elements may be loaded onto the memory 210 of the computer device 200 based on a computer program installed by files received over the network 170.

The processor 220 may be configured to process instructions of a computer program by performing basic arithmetic, logic and I/O operations. The instructions may be provided to the processor 220 by the memory 210 or the communication interface 230. For example, the processor 220 may be configured to execute received instructions based on a program code stored in a recording device, such as the memory 210.

The communication interface 230 may provide a function for enabling the computer device 200 to communicate with other devices (e.g., the aforementioned storage devices) over the network 170. For example, a request, an instruction, data or a file generated by the processor 220 of the computer device 200 based on a program code stored in a recording device, such as the memory 210, may be provided to other devices over the network 170 under the control of the communication interface 230. Inversely, a signal, an instruction, data or a file from another device may be received by the computer device 200 through the communication interface 230 of the computer device 200 over the network 170. The signal, instruction or data received through the communication interface 230 may be transmitted to the processor 220 or the memory 210. The file received through the communication interface 230 may be stored in a storage device (i.e., the aforementioned permanent storage device) which may be further included in the computer device 200.

The I/O interface 240 may be means for an interface with an I/O device 250. For example, the input device may include a device, such as a microphone, a keyboard, or a mouse. The output device may include a device, such as a display or a speaker. For another example, the I/O interface 240 may be means for an interface with a device in which functions for input and output have been integrated into one, such as a touch screen. The I/O device 250, together with the computer device 200, may be configured as a single device.

Furthermore, in other embodiments, the computer device 200 may include elements greater or smaller than the elements of FIG. 2. However, it is not necessary to clearly illustrate most of conventional elements. For example, the computer device 200 may be implemented to include at least some of the I/O devices 250 or may further include other elements, such as a transceiver and a database.

Figure 3:
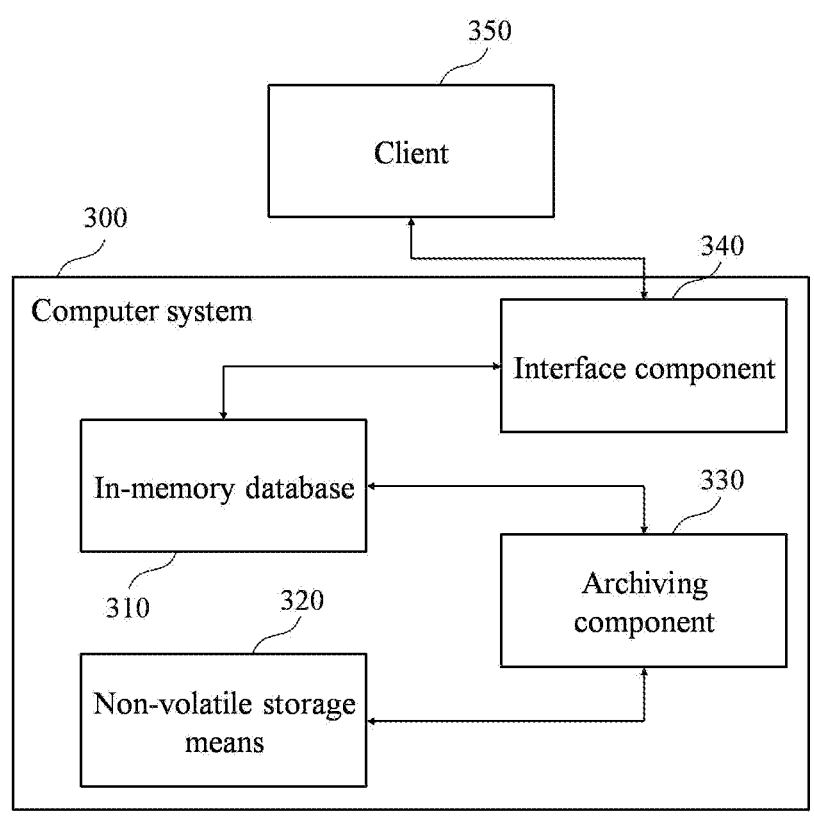
FIG. 3 is a diagram illustrating a schematic shape of a computer system for archiving in an embodiment of the present disclosure.

FIG. 3 is a diagram illustrating a schematic shape of a computer system for archiving in an embodiment of the present disclosure. The computer system 300 of FIG. 3 may be implemented by the computer device 200, and may include an in-memory database 310, non-volatile storage means 320, an archiving component 330, and an interface component 340.

Data stored in the in-memory database 310 may be archived in the non-volatile storage means 320 by the processing of the archiving component 330. Furthermore, the data archived in the non-volatile storage means 320 may be restored or searched for in the in-memory database 310 by the processing of the archiving component 330.

In some embodiments, the non-volatile storage means 320 may be external to the computer system 300. For example, the non-volatile storage means 320 may be included in another computer device connected to the computer system 300 over a network. The another computer device may be independently present or may be part of a cloud system.

Furthermore, at least one of a function for archiving, by the archiving component 330 according to an embodiment, data, a function for restoring data and a function for searching for data may be provided through an external service. For example, the archiving component 330 may archive, restore and/or search for data using functions provided by an external service based on an API call.

Figure 4:
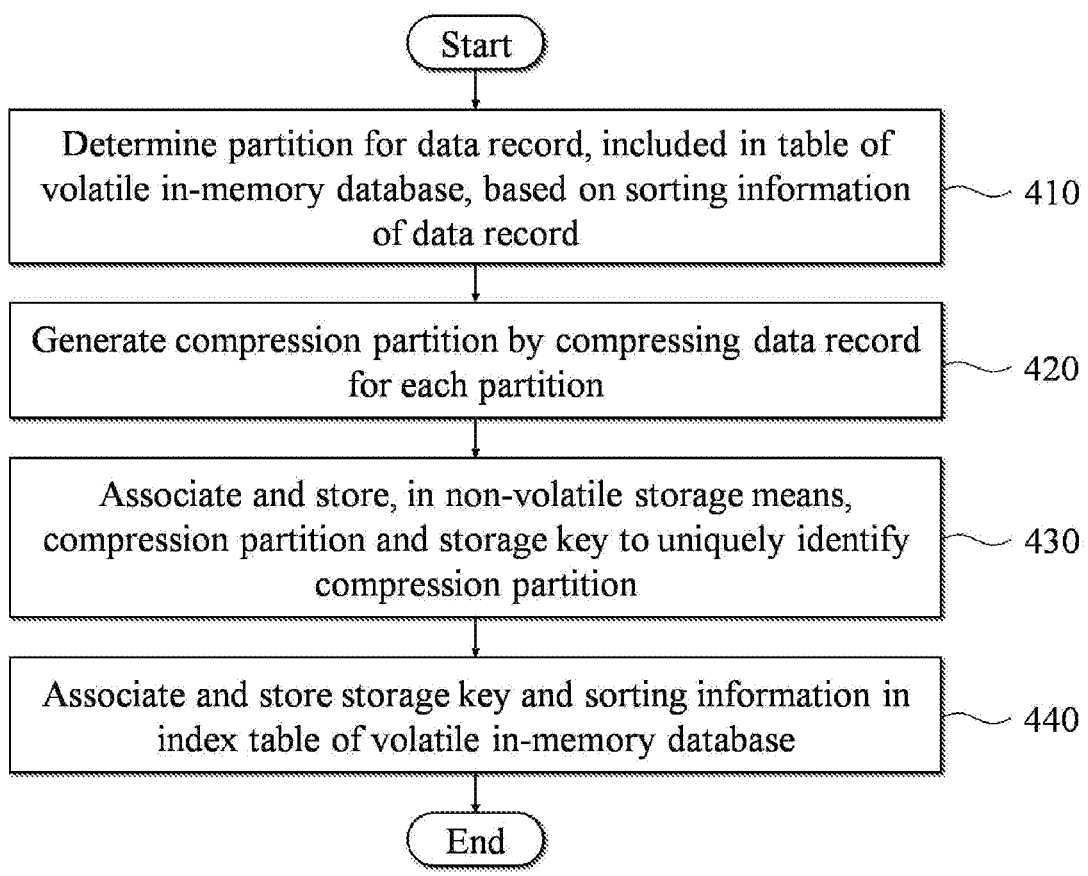
FIG. 4 is a flowchart illustrating an example of a data processing method for archiving data in an embodiment of the present disclosure.

FIG. 4 is a flowchart illustrating an example of a data processing method for archiving data in an embodiment of the present disclosure. The data processing method according to the present embodiment may be performed the computer device 200 that implements the computer system 300 described with reference to FIG. 3. In this case, the processor 220 of the computer device 200 may be implemented to execute a control instruction according to a code of an operating system or a code of at least one computer program included in the memory 210. In this case, the processor 220 may control the computer device 200 to perform steps 410 to 440 of the method of FIG. 4 according to a control instruction provided by a code stored in the computer device 200.

At step 410, the computer device 200 may determine a partition for a data record, included in a table of a volatile in-memory database, based on sorting information of the data record. In this case, the volatile in-memory database may correspond to the in-memory database 310 described with reference to FIG. 3. The sorting information may include information on time of the data record and/or a given field value of the data record. The computer device 200 may determine the partition for the data record based on the information on time and/or the field value. The table is a unit that forms a basic structure in which data is stored in the in-memory database. The table described at step 410 may be a table to be archived in order to reduce a capacity, among a plurality of tables included in the in-memory database.

For example, the computer device 200 may sort data records, each one having a field value within a given range, as one partition. In this case, the field value may be determined as a field value of a field that is most frequently searched for in the table. The reason for this is that when archived data is subsequently searched for, search efficiency can be maximized using index information generated based on a corresponding field value. For another example, the computer device may sort data records, each one having information on time within a given range, as one partition.

Furthermore, the partition may be configured with a set of data records selected among all data records included in the table. At least one partition may be generated. If necessary, a partition may be generated for only some data records not all the data records of a table. For example, a partition for archiving may be generated for only data records prior to the year 2015 except data records after the year 2015 in a table.

The number of data records included in one partition may be determined by comprehensively analyzing and reviewing a total number of records included in a table, performance of a computer that searches the in-memory database, and a search condition having high frequency in the in-memory database.

In another embodiment, when a partition in which the number of data records exceeds a threshold is present in sorted partitions, the exceeding partition may be separated into a plurality of partitions in each of which the number of data records is the threshold or less. For example, the threshold, that is, the number of data records which may be included in one partition, may be set to 100,000. However, if a sorted partition includes the number of data records exceeding the threshold, this may be problematic because overload and inefficiency of a computer may be caused. Accordingly, if one partition includes more than 100,000 data records, several partitions may be generated by separating the one partition into a plurality of partitions each including 100,000 data records. For example, if one partition includes 250,000 data records, the computer device 200 may separate an exceeding partition into a total of three partitions, including two partitions each having 100,000 data records and a partition having 50,000 data records.

There may be no method of distinguishing between a plurality of partitions separated as described above because the plurality of partitions has been sorted according to a classification criterion based on the same field value. Accordingly, serial numbers (e.g., 1, 2, 3, and 4) may be assigned to the plurality of separated record groups, respectively, and may be further stored in the serial number field of an index table. In this case, even when archived data is searched for, a plurality of separated partitions may be distinguished from each other and searched for. Such a serial number may correspond to a sequence to be described later.

At step 420, the computer device 200 may generate a compression partition by compressing a data record for each partition. For example, the computer device 200 may generate a compression partition by compressing, into a binary object, a data record included in the determined partition.

For example, in order to generate a compression partition, first, the computer device 200 may store, in a buffer, a data record to be included in the compression partition. The size of the buffer in which the data record is stored may be determined based on a structure (e.g., the number, type and size of fields) of a table and the threshold of a data record to be included in a compression partition. For example, assuming that a table includes a total of three fields including DATE (text 8 letters), NAME (text 30 letters), and AGE (integer 4 bytes) and the threshold of the number of data records included in a compression partition is 100,000, when text 1 letter is calculated as 2 bytes, the size of a buffer may be at least 100,000*(8*2+30*2+4)=8 million bytes (about 8 mega bytes). In this case, the computer device 200 may sequentially read all data records included in the compression partition and field values of the data records, and may sequentially store the read data records and field values in the buffer.

Thereafter, the computer device 200 may generate a compression partition by compressing the data stored in the buffer. The compression partition may be the results of a binary object form generated by compressing the data stored in the buffer. In this case, in order to prevent a loss attributable to the compression from occurring, ZIP, CTW, LZ77, LZW, gzip, bzip2, or DEFLATE, that is, a lossless compression algorithm, may be used.

In this case, the computer device 200 may generate a storage key uniquely assigned to each generated compression partition.

At step 430, the computer device 200 may associate and store, in the non-volatile storage means, the compression partition and the storage key to uniquely identify the compression partition. As already described above, the non-volatile storage means may be included in the computer device 200, but may be included in another computer device connected to the computer device 200 over the network. For example, the compression partition may be stored in a compression table in which archived data is compressed and stored in a partition unit in the non-volatile storage means. The compression table may include a field for storing a compression partition compressed and generated for each partition and a field for storing a storage key uniquely assigned to correspond to a corresponding compression partition. The storage key is a key including a value uniquely assigned to each compression partition. A value of a storage key shared for each compression partition may be stored in a field of a compression table corresponding to the storage key. Furthermore, one or more fields may correspond to a storage key. When values of storage keys distributed and stored in one or more fields are combined, a unique storage key may be implemented to be formed for each compression partition.

At step 440, the computer device 200 may associate and store the storage key and the sorting information in an index table of the volatile in-memory database. For example, if the sorting information includes a given field value of a corresponding data record, at step 440, the computer device 200 may associate and store the storage key and the given field value in a group index table. The storage key and the field value stored in the group index table may be used as an index for searching for a compressed and stored data record according to a search condition including the given field value. For another example, if the sorting information includes information on time of a data record, the computer device 200 may associate and store the storage key and the information on time in a period index table. The storage key and the information on time, stored in the period index table, may be used as an index for searching for a compressed and stored data record according to a search condition including information on a given time. In other words, the index table including the group index table and/or the period index table may be used to obtain a storage key corresponding to the field value and/or the information on time included in the search condition. The storage key may be used to obtain a compression partition, corresponding to the storage key, from the non-volatile storage means (or a compression table included in the non-volatile storage means).

Figure 5:
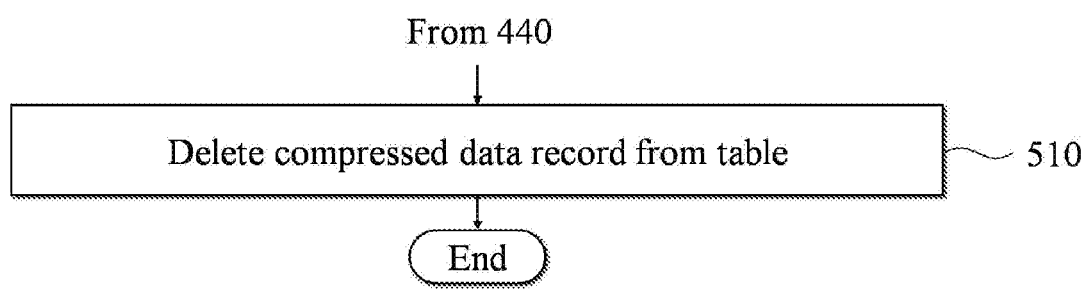
FIG. 5 is a flowchart illustrating another example of a data processing method for archiving data in an embodiment of the present disclosure.

FIG. 5 is a flowchart illustrating another example of a data processing method for archiving data in an embodiment of the present disclosure. The data processing method according to the present embodiment may further include step 510 after step 440 described with reference to FIG. 4.

At step 510, the computer device 200 may delete a compressed data record from a table. An object of archiving a database by compressing the data is to reduce the storage space of the database. Accordingly, the computer device 200 may reduce the storage space of the in-memory database by deleting archived data records from a table. However, in some embodiments, a compressed data record may not be immediately deleted from a table, but may be deleted after a lapse of a given period.

A deleted data record may be subsequently restored to a corresponding table. For example, the computer device 200 may search the index table for a storage key, associated with identification information included in a restoration request, in response to the restoration request for a deleted data record, and may search the non-volatile storage means (or a compression table included in the non-volatile storage means) for a compression partition associated with the retrieved storage key. Thereafter, the computer device 200 may restore the deleted data record by decompressing the retrieved compression partition, and may record the restored data record on a table based on the identification information. In this case, pieces of information of the key index table to be described later may be used to identify a specific data record for which restoration has been requested, among data records included in the compression partition.

Figure 6:
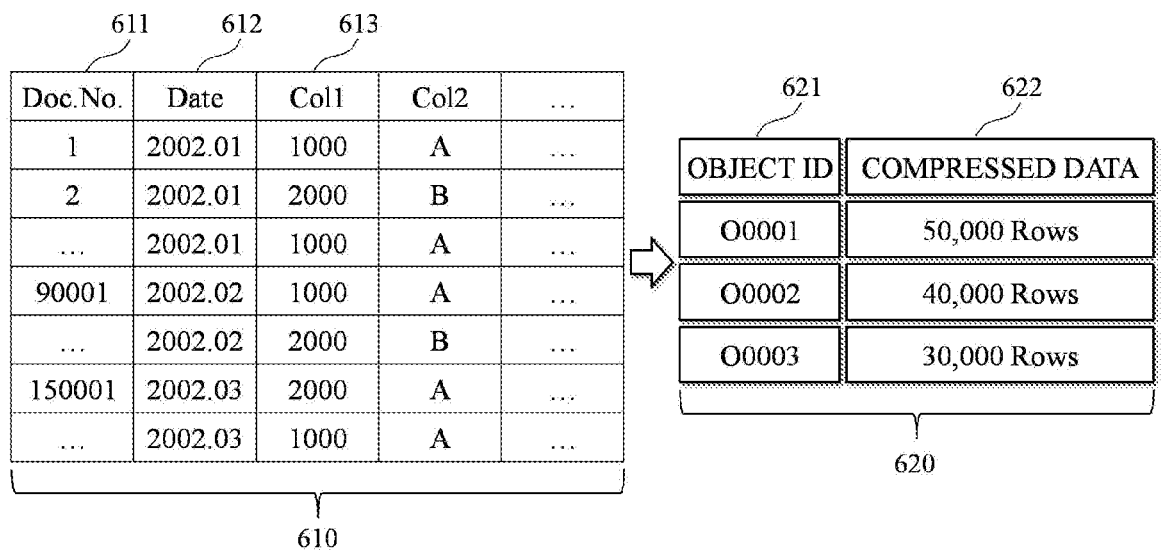
FIG. 6 is a diagram illustrating a first example of the structure of a compression table according to an embodiment of the present disclosure.

FIG. 6 is a diagram illustrating a first example of the structure of a compression table according to an embodiment of the present disclosure. In FIG. 6, a table 610 includes a Doc.No. field 611, a Date field 612 for time, and a Col1 field 613 for a specific attribute. In this case, the computer device 200 may generate a compression partition by sorting and compressing a data record of the table 610 based on a field value of the Date field 612 or a field value of the Col1 field 613 of the table 610, that is, information on time, as sorting information. In this case, the computer device 200 may generate a compression table 600 by associating and storing the compression partition and a storage key for uniquely identifying the corresponding compression partition. For example, the compression table 600 according to the embodiment of FIG. 6 may include an OBJECT ID field 621 having a storage key as a field value and a COMPRESSED DATA field 622 having a compression partition as a field value.

Figure 7:
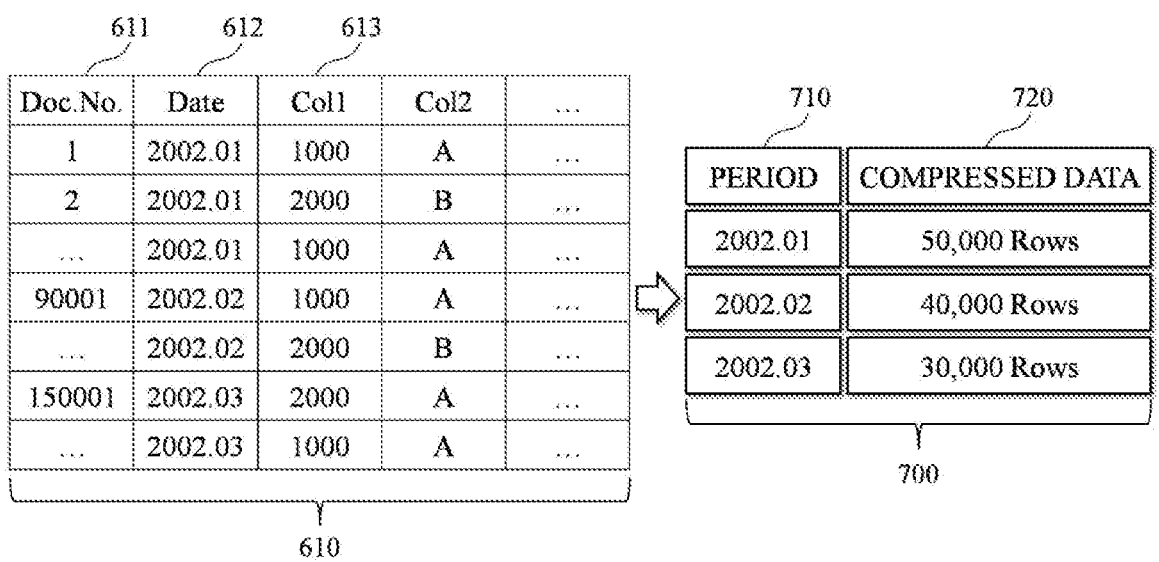
FIG. 7 is a diagram illustrating a second example of the structure of the compression table according to an embodiment of the present disclosure.

FIG. 7 is a diagram illustrating a second example of the structure of a compression table according to an embodiment of the present disclosure. FIG. 8 is a diagram illustrating an example of the structure of a period index table according to an embodiment of the present disclosure. FIG. 9 is a diagram illustrating an example of the structure of a group index table according to an embodiment of the present disclosure.

FIG. 7 describes another embodiment in which a compression table 700 generated through the table 610 described with reference to FIG. 6. For example, the computer device 200 may generate a compression partition by sorting and compressing a data record of the table 610 based on a field value of the Datefield 612 of the table 610, that is, information on time, as sorting information. Furthermore, the computer device 200 may generate the compression table 700 by associating and storing the sorting information and the corresponding compression partition. For example, the compression table 700 according to the embodiment of FIG. 7 may include a PERIOD field 710 having information on time as a field value and a COMPRESSED DATA field 720 having a compression partition as a field value.

FIG. 8 illustrates an example of a period index table 800 which may be generated and used if the compression table 620 includes compression partitions generated by sorting and compressing data records based on field values (i.e., information on time) of the Date field 612. In this case, the period index table 800 may include a PERIOD field 810 having information on time as a field value and an OBJECT ID field 820 having a storage key as a field value. For example, when receiving a search condition including information on time (e.g., "2020.01") as sorting information, the computer device 200 may search the period index table 800 for a storage key (e.g., a storage key "O0001" corresponding to information on time "2020.01" in the period index table 800) using information on time included in the search condition, and may search the compression table 620 for a compression partition (e.g., a compression partition "50,000 Rows" corresponding to the storage key "O0001" in the compression table 620), corresponding to the storage key, using the retrieved storage key.

Furthermore, FIG. 9 illustrates an example of a group index table 900 including compression partitions generated by sorting and compressing data records based on field values of the Col1 field 613 of the compression table 620. In this case, the group index table 900 may include a PERIOD field 910 having a field value of the Col1 field 613 as its own field value and an OBJECT ID field 920 having a storage key as a field value. For example, when receiving a search condition including a field value (e.g., "1000") of the Col1 field 613 as sorting information, the computer device 200 may search the group index table 900 for a corresponding storage key (e.g., a storage key "O0001" corresponding to the field value "1000" in the group index table 900) using the field value included in the search condition, and may search the compression table 620 for a compression partition (e.g., the compression partition "50,000 Rows", corresponding to the storage key "O0001", in the compression table 620) corresponding to the storage key using the retrieved storage key.

Figure 10:
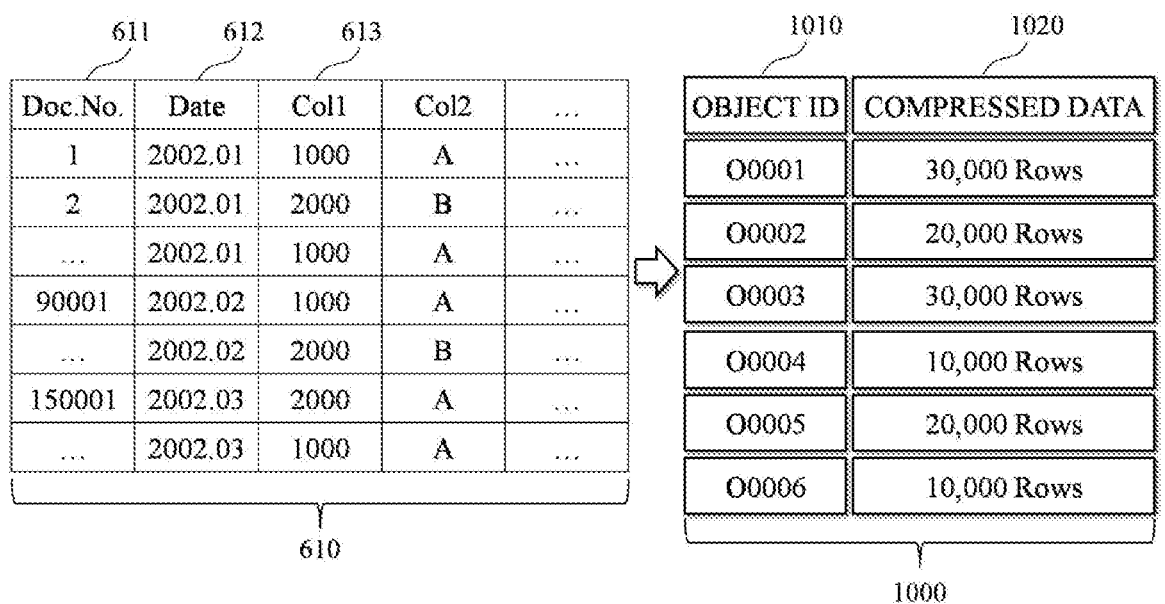
FIG. 10 is a diagram illustrating a second example of the structure of a compression table according to an embodiment of the present disclosure.

FIG. 10 is a diagram illustrating a second example of the structure of a compression table according to an embodiment of the present disclosure. FIG. 11 is a diagram illustrating an example of the structure of an index table having a form in which the period index table and the group index table are combined in an embodiment of the present disclosure.

FIG. 10 describes another embodiment in which a compression table 1000 is generated through the table 610 described with reference to FIG. 6. For example, the computer device 200 may generate a compression partition by sorting and compressing data records of the table 610 based on two field values, that is, a field value of the Date field 612 and a field value of the Col1 field 613 of the table 610, that is, information on time.

As a more detailed example, the computer device 200 may generate a first compression partition by compressing data records in each of which a field value of the Data field 612 is "2002.01" and a field value of the Col1 field 613 is "1000", may generate a second compression partition by compressing data records in each of which a field value of the Data field 612 is "2002.01" and a field value of the Col1 field 613 is "2000", may generate a third compression partition by compressing data records in each of which a field value of the Data field 612 is "2002.02" and a field value of the Col1 field 613 is "1000", may generate a fourth compression partition by compressing data records in each of which a field value of the Data field 612 is "2002.02" and a field value of the Col1 field 613 is "2000", may generate a fifth compression partition by compressing data records in each of which a field value of the Data field 612 is "2002.03" and a field value of the Col1 field 613 is "1000", and may generate a sixth compression partition by compressing data records in each of which a field value of the Data field 612 is "2002.03" and a field value of the Col1 field 613 is "2000."

In this case, the computer device 200 may generate the compression table 1000 by associating and storing the compression partition and a storage key for uniquely identifying the corresponding compression partition. For example, the compression table 1000 according to the embodiment of FIG. 10 may include an OBJECT ID field 1010 having a storage key as a field value and a COMPRESSED DATA field 1020 having a compression partition as a field value.

FIG. 11 illustrates an example of an index table 1100 having a form in which the period index table and the group index table are combined. In this case, the index table 1100 may include a PERIOD field 1110 having information on time as a field value, a Col1 field 1120 having a field value of the Col1 field 613 as its own field value, and an OBJECT ID field 1130 having a storage key as a field value. For example, when receiving a search condition including information on time (e.g., "2020.02") and a field value (e.g., "1000") of the Col1 field 613 as sorting information, the computer device 200 may search the index table 1100 for a storage key (e.g., a storage key "O0003" in the index table 1100) that satisfies both the information on time and the field value included in the search condition, and may search the compression table 1000 for a compression partition (e.g., the compression partition "30,000 Rows" corresponding to the storage key "O0003" in the compression table 1000) corresponding to the storage key using the retrieved storage key.

As described above, the data processing method according to an embodiment of the present disclosure has an effect in that it can significantly reduce the capacity of the in-memory database by archiving the in-memory database through a compressing procedure. Furthermore, search efficiency can be maximized because the original table of the non-volatile storage means for storing compressed data is accessed through the index table included in the in-memory database and corresponding archived data is subsequently restored and searched for.

An index table included in a volatile in-memory database may be backed up to separate non-volatile storage means because data may be damaged depending on a characteristic of the in-memory database. The non-volatile storage means to which the index table is backed up may be the same as or different from the non-volatile storage means for storing a compression partition. For example, a case where a compression partition is stored in non-volatile storage means included in an external system of the computer device 200 and an index table is backed up to a local repository of the computer device 200 may be taken into consideration.

Figure 12:
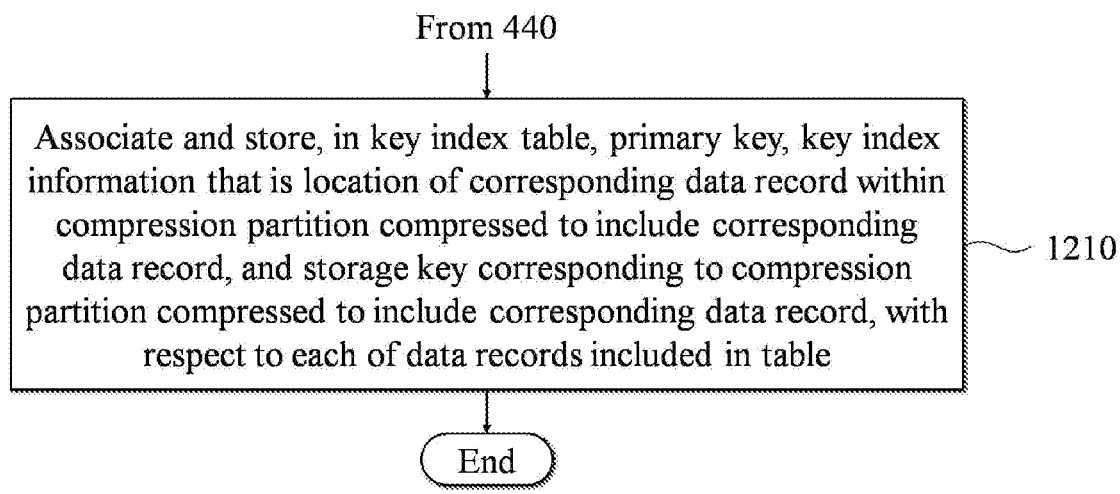
FIG. 12 is a flowchart illustrating still another example of a data processing method for archiving data in an embodiment of the present disclosure.

FIG. 12 is a flowchart illustrating still another example of a data processing method for archiving data in an embodiment of the present disclosure. The data processing method according to the present embodiment may further include step 1210 after step 440 described with reference to FIG. 4.

At step 1210, the computer device 200 may associate and store, in the key index table, a primary key, key index information that is the location of a corresponding data record within a compression partition compressed to include the corresponding data record, and a storage key corresponding to the compression partition compressed to include the corresponding data record, with respect to each of data records included in a table.

The primary key may mean a corresponding value in a field having a uniquely identified value for each record in the in-memory database, and may also be called a basic key, a main key or a unique key. Furthermore, one or more primary keys may be present in one table. Furthermore, the key index information is information on where a data record having a value of a specific primary key is stored within a compression partition. For example, information on a storage sequence indicating that a data record is stored at a (1000)-th position, among information on 100,000 data records included in a compression partition, may be stored as the key index information.

The reason why the primary key is stored in a key index table is for a table, that is, a search target, can be directly searched for by a corresponding primary key, in addition to another field value and information on time. That is, when a user tries to search the table for a data record having a specific primary key while inputting the specific primary key, the key index table may be used. More specifically, the computer device 200 may search the key index table for key index information and a storage key for a data record having a specific primary key. In this case, the computer device 200 may obtain, from the non-volatile storage means (or a compression table included in the non-volatile storage means), a compression partition corresponding to the storage key using the obtained storage key, and may search the compression partition for the data record desired by the user using the key index information. As already described above, such key index information of a key index table may be used to identify a data record having a specific condition, among data records included in a compression partition, in restoring the data record having the specific condition in the table.

Figure 13:
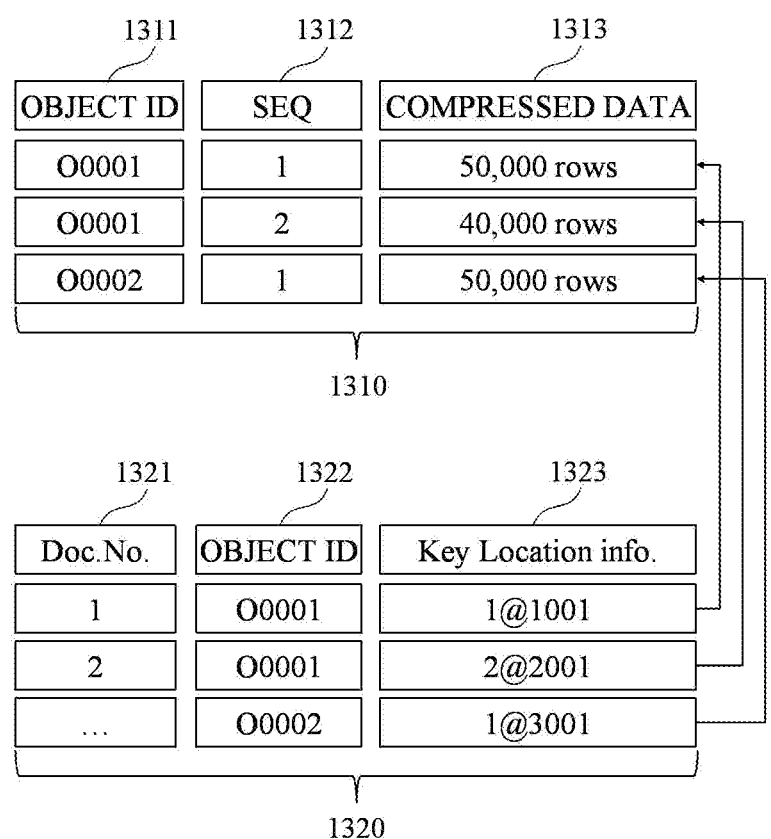
FIG. 13 is a diagram illustrating an example of the structure of a compression table and a key index table according to an embodiment of the present disclosure.

FIG. 13 is a diagram illustrating an example of the structure of a compression table 1310 and a key index table 1320 according to an embodiment of the present disclosure.

The compression table 1310 may include an OBJECT ID field 1311 having a storage key as a field value, an SEQ field 1312 having the sequence of a target table as a field value, and a COMPRESSED DATA field 1313 having a compression partition as a field value. The sequence may be defined as a sequence in which assuming that a parent table and a child table are present, the parent table is first extracted and the child table is extracted using extracted data of the parent table.

The key index table 1320, as already described, may include a Doc.No. field 1321 having a primary key as a field value, an OBJECT ID field 1322 having a storage key as a field value, and a Key Location info. field 1323 having key index information as a field value. For example, in key index information 1@1001, "1" ahead of "@" may indicate a sequence corresponding to a field value of the SEQ field 1312, and "1001" subsequent to "@" may indicate a (1,001)-th data record among data records included in a corresponding compression partition. As a more detailed example, the first record of the key index table 1320 may indicate that a data record having a primary key of "1" may be included as a 1,001-th data record among the data records of a compression partition having a storage key of "O0001" and a sequence of "1." Likewise, the second record of the key index table 1320 may indicate that a data record having a primary key of "2" may be included as a (2,001)-th data record among the data records of a compression partition having a storage key of "O0001" and a sequence of "2."

As described above, the key index information may include information on the location of a specific data record within a compression partition. The number of data records to be inquired can be reduced depending on a search condition of a user using a key index table (e.g., the key index table 1320 of FIG. 13), including key index information, a primary key and a storage key.

In another embodiment, the computer device 200 may search a connection table, connected to a first table (e.g., the table described at step 410) through a primary key, for a data record that belongs to data records included in a second compression partition generated by compressing the data records and that has the same primary key as a data record included in the first table, and may further store subindex information, that is, a location of the retrieved data record within the second compression partition, with respect to a data record having the same primary key in a key index table. The connection table is a table connected to the first table through the primary key. That is, the primary key may be present in both the first table and the connection table. The second compression partition may be data generated by compressing data records in a connection table, when the corresponding connection table connected to a first table through a primary key is present. In this case, the second compression partition may be generated using the same method as the compression partition described with reference to FIG. 4, and may be stored in the non-volatile storage means (or a compression table included in the non-volatile storage means) along with a unique storage key like a compression partition. The subindex information is information on where a data record having a specific primary key is stored within the second compression partition. For example, information on a storage sequence indicating that a data record stored at a (1000)-th position, among information on 100,000 data records included in the second compression partition, may be stored as the subindex information. For example, if a connection table connected to a first table through a primary key is present in a database, with respect to a field that is not present in the first table, but is present in the connection table, a user may require field value information of the field. In this case, the computer device 200 may further store subindex information for a data record having the same primary key in the key index table so that even up to the connection table can be searched for.

In still another embodiment, if multiple connection tables are present in a first table, the computer device 200 may collect and compress pieces of subindex information of the connection tables, and may store the compressed subindex information in the key index table as new subindex information. For example, the computer device 200 may collect all of pieces of subindex information on locations within two or more second compression partitions with respect to data records having the same primary key in a connection table, may compress the collected values, and may store, as new subindex information, in a data record having the same primary key value in the key index table.

Figure 14:
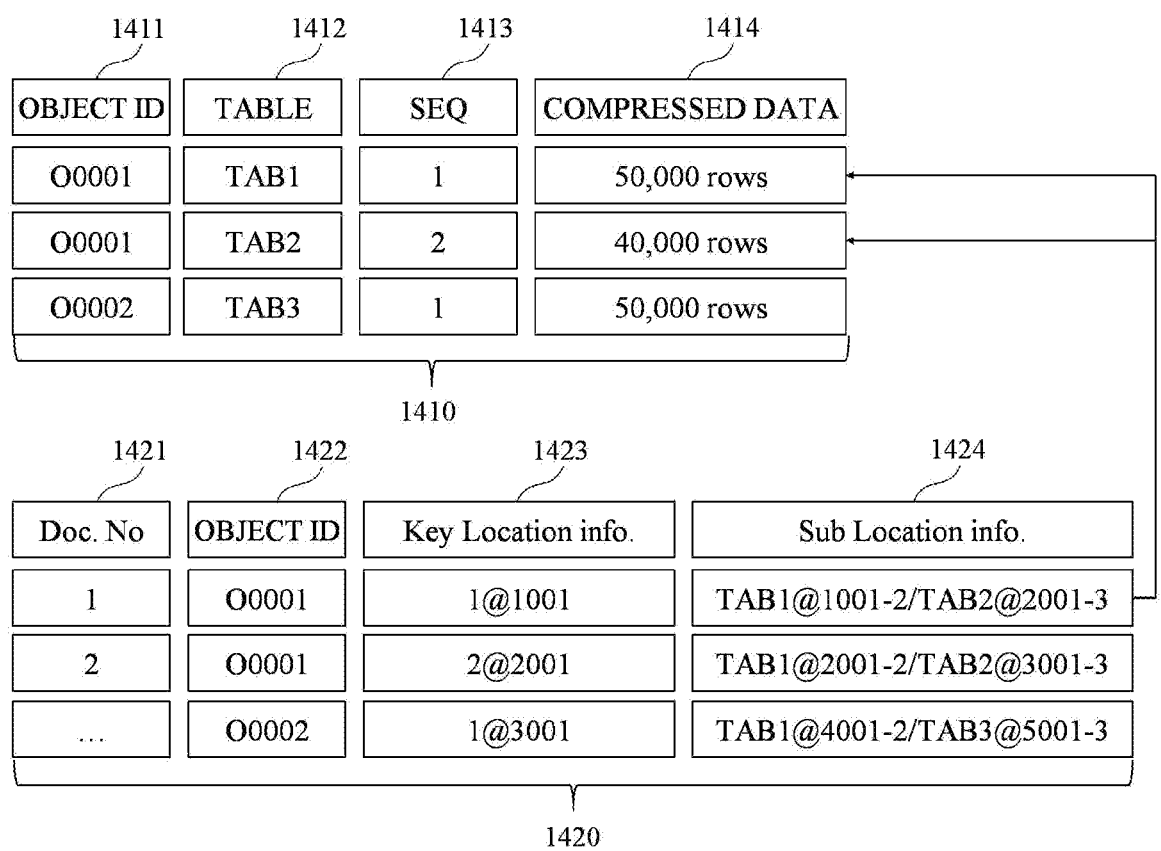
FIG. 14 is a diagram illustrating another example of the structure of a compression table and a key index table according to an embodiment of the present disclosure.

FIG. 14 is a diagram illustrating another example of the structure of a compression table 1410 and a key index table 1420 according to an embodiment of the present disclosure.

The compression table 1410 may include an OBJECT ID field 1411 having a storage key as a field value, a TABLE field 1412 having the identifier of a table as a field value, a SEQ field 1413 having a sequence as a field value, and a COMPRESSED DATA field 1414 having a compression partition as a field value. The TABLE field 1412 may include the identifier of a table as a field value. Accordingly, the TABLE field 1412 may identify that a corresponding compression partition includes data records extracted from which table.

The key index table 1420 according to the present embodiment may include a Doc.No. field 1421 having a primary key as a field value, an OBJECT ID field 1422 having a storage key as a field value, a Key Location info. field 1423 having key index information as a field value, and a Sub Location info. field 1424 having subindex information as a field value.

For example, the first record of the key index table 1420 may indicate that a data record having a primary key of "1" is included as a (10,001)-th data record, among data records of a compression partition having a storage key of "O0001" and a sequence of "1." In this case, the field value "TAB1@1001-2/TAB2@2001-3" of the Sub Location info. field 1424 illustrates the location of a data record, having the primary key of "1", within a second compression partition generated with respect to a connection table. For example, in the field value "TAB1@1001-2/TAB2@2001-3", "TAB1" and "TAB2" ahead of "@" may mean connection tables connected through the same primary key. "1001-2" subsequent to "@" illustrates two data records (i.e., a (1,001)-th data record (first data record) and a (1,002)-th data record (second data record)) from the (1,001)-th data record, among data records included in the second compression partition for the connection table "TAB1." Furthermore, "2001-3" subsequent to "@" illustrates three data records (i.e., a (2,001)-th data record (third data record), a (2,002)-th data record (fourth data record) and a (2,003)-th data record (fifth data record)) from the (2,001)-th data record, among the data records included in the second compression partition for the connection table "TAB2." In this case, all the data records from the first data record to the fifth data record may be identified by the same primary key.

Figure 15:
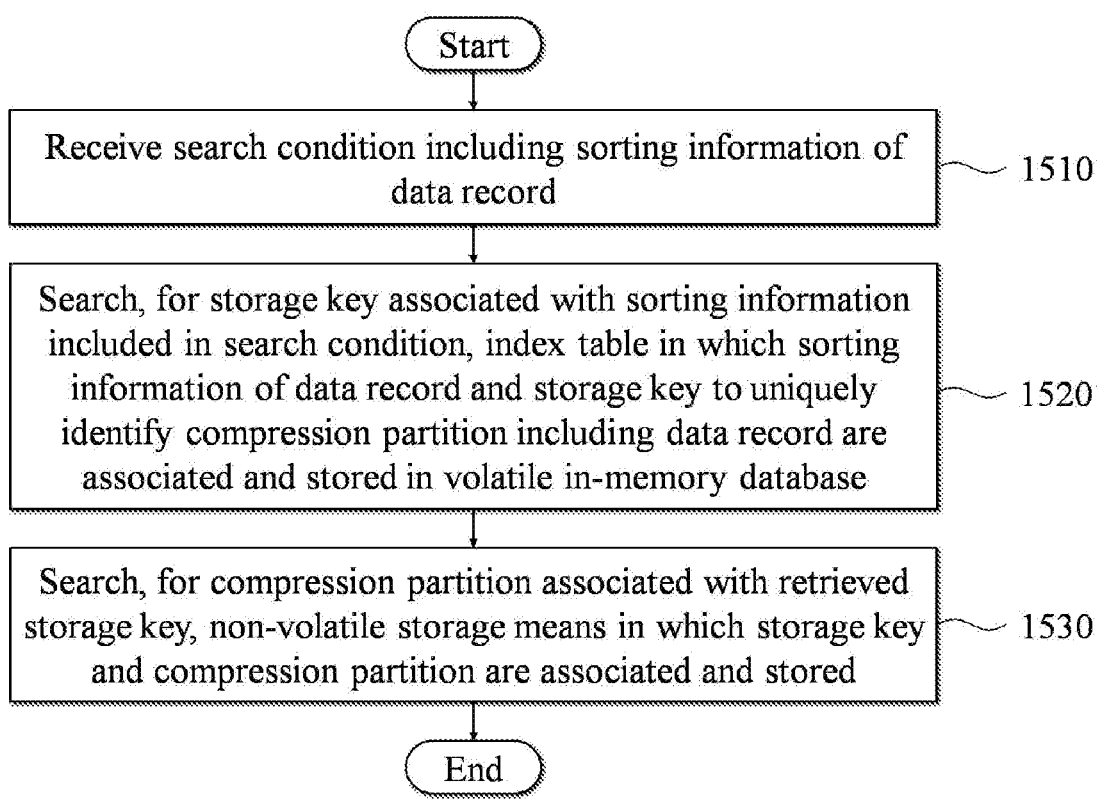
FIG. 15 is a diagram illustrating an example of a data processing method for searching for archived data in an embodiment of the present disclosure.

FIG. 15 is a diagram illustrating an example of a data processing method for searching for archived data in an embodiment of the present disclosure. The data processing method according to the present embodiment may also be performed by the computer device 200.

At step 1510, the computer device 200 may receive a search condition including sorting information of a data record. The sorting information may include a given field value of a data record to be searched for and/or information on time of the corresponding data record. The field value and/or information on time included in the sorting information may be included in the form of a range.

At step 1520, the computer device 200 may search, for a storage key associated with the sorting information included in the search condition, an index table in which sorting information of a data record and a storage key to uniquely identify a compression partition including a data record are associated and stored in a volatile in-memory database. As already described above, the index table may include a group index table and/or a period index table. The group index table may associate and store a specific field value and a storage key. The period index table may associate and store information on time and the storage key. Accordingly, the computer device 200 may search the group index table and/or the period index table for a storage key corresponding to a field value included in the sorting information and/or information on time. For example, when sorting information includes a given field value of a data record, the computer device 200 may search a group index table in which a storage key and the given field value are associated and stored, for the storage key associated with the given field value, which is included as the sorting information of a search condition. For another example, when sorting information includes information on time of a data record, the computer device 200 may search a period index table in which a storage key and the information on time are associated and stored, for the storage key associated with the information on time, which is included as sorting information of a search condition.

At step 1530, the computer device 200 may search, for a compression partition associated with the retrieved storage key, the non-volatile storage means in which a storage key and a compression partition are associated and stored. As already described above, the non-volatile storage means (or a compression table included in the non-volatile storage means) associates and stores a compression partition and a storage key to uniquely identify the compression partition. Accordingly, the computer device 200 may search the non-volatile storage means for a corresponding compression partition based on a storage key.

As already described above, if a key index table is further used, a user may use a primary key for search. As described above, the key index table may associate and store a primary key, key index information that is a location of a corresponding data record within a compression partition compressed to include the corresponding data record, and a storage key corresponding to the compression partition compressed to include the corresponding data record, with respect to each of data records included in a given table in a volatile in-memory database. In this case, if a search condition further includes the primary key of the data record, the computer device 200 may search the key index table for key index information and a storage key associated with the primary key further included in the search condition. Thereafter, the computer device 200 may search the compression partition, retrieved at step 1530, for a specific data record according to the search condition further based on the retrieved key index information and storage key.

Furthermore, when a connection table connected to a given table through a primary key is present, the key index table may further include subindex information, that is, a location of a data record in a second compression partition generated by compressing the data record in the connection table. Accordingly, if a search condition further includes a primary key, the computer device 200 may further search the key index table for subindex information associated with the primary key further included in the search condition, and may further search the second compression partition for a data record according to the search condition based on the second compression partition and the subindex information. Accordingly, the computer device 200 can also obtain a field value of the connection table connected to a first table through the primary key in addition to a field value of the first table, with respect to a specific data record.

As already described above, the non-volatile storage means may include non-volatile storage means of another computer device connected to the computer device 200 over a network. In this case, at step 1530, the computer device 200 may search the non-volatile storage means of the another computer device, connected thereto over the network, for a compression partition associated with the storage key retrieved at step 1520.

Figure 16:
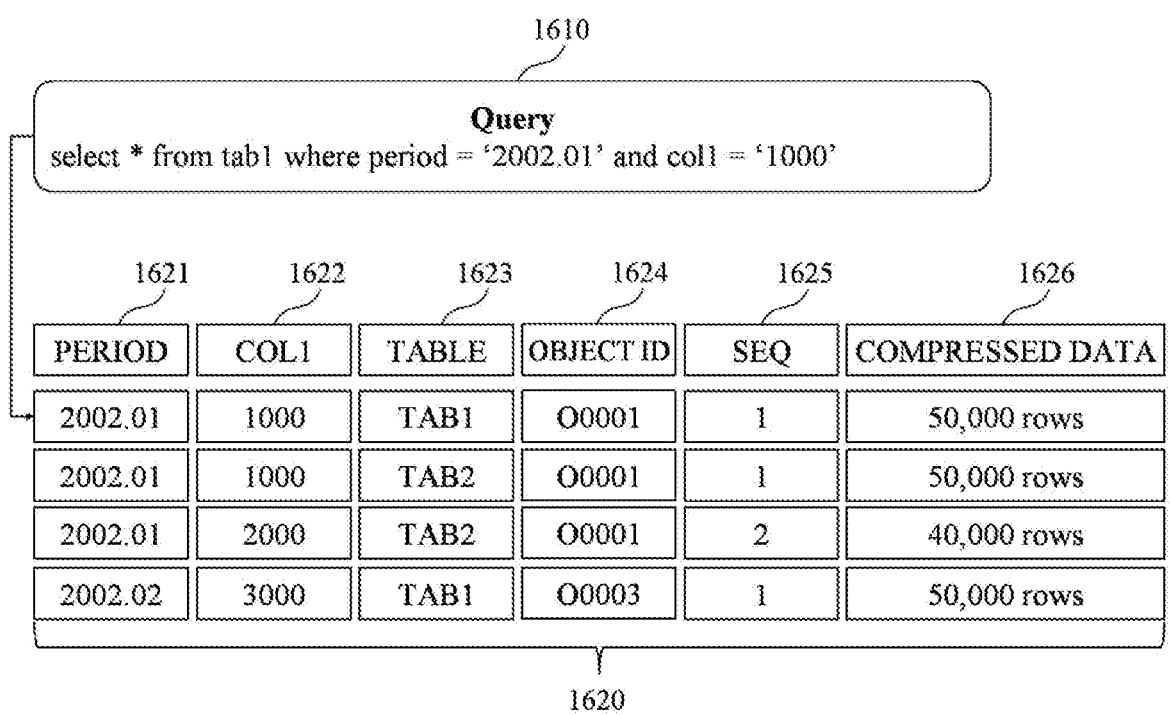
FIGS. 16 and 17 are diagrams illustrating examples in which archived data is searched for in an embodiment of the present disclosure.
Figure 17:
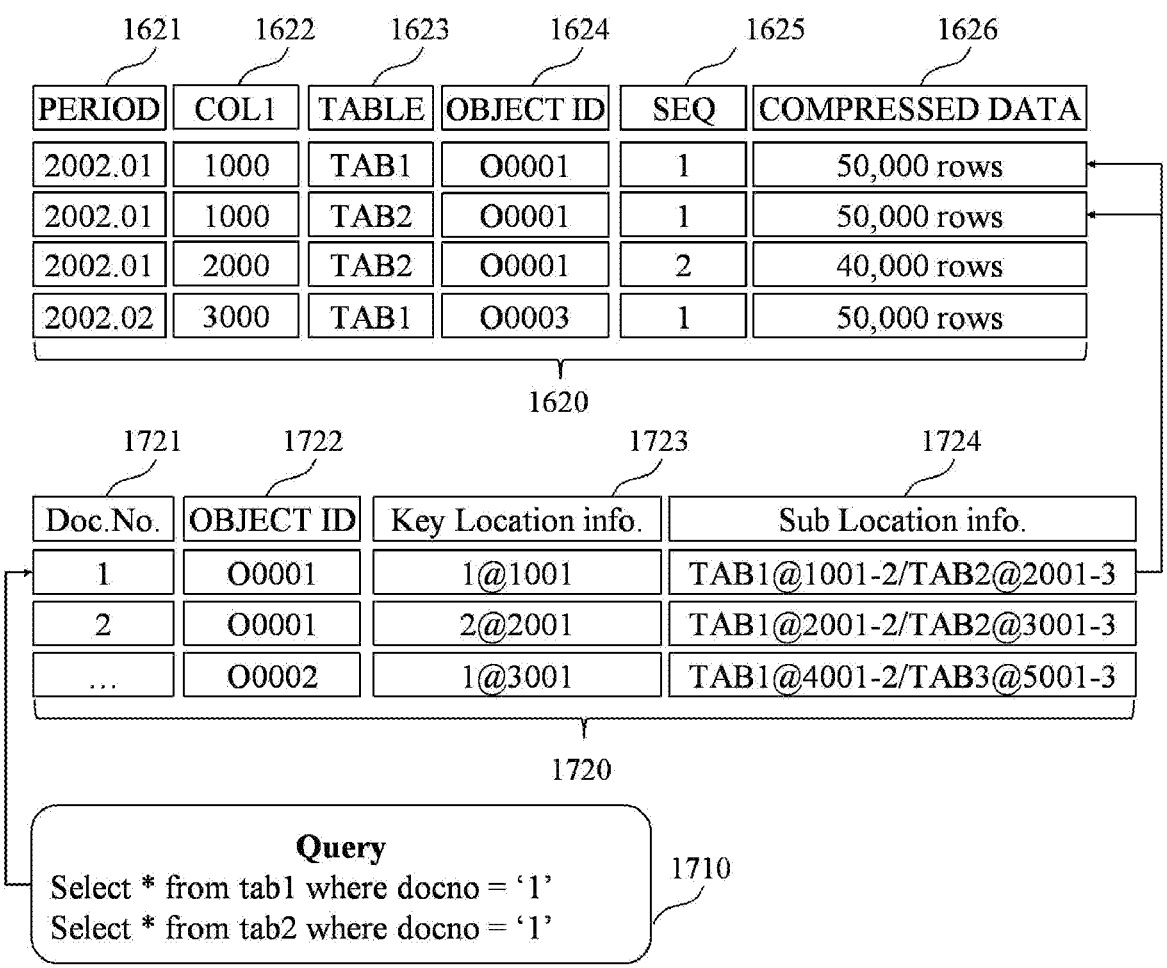

FIGS. 16 and 17 are diagrams illustrating examples in which archived data is searched for in an embodiment of the present disclosure.

FIG. 16 illustrates an example in which archived data is searched for in a compression table 1620 through a query 1610. In the embodiment of FIG. 16, the compression table 1620 has a form combined with an index table, and includes a PERIOD field 1621, a COL1 field 1622, a TABLE field 1623, an OBJECT ID field 1624, a SEQ field 1625, and a COMPRESSED DATA field 1626. In some embodiments, the PERIOD field 1621 and the COL1 field 1622 may be present in separate index tables. In this case, in order to connect the compression table 1620 and the index tables, the OBJECT ID field 1624 may be present in each of the two index tables. In some embodiments, the TABLE field 1623 and the SEQ field 1625 may also be present in the index table.

The query 1610 may mean an instruction that instructs to search a table "TAB1" for a data record in which a field value of the PERIOD field 1621 is "2002.01" and a field value of the COL1 field 1622 is "1000." In this case, the computer device 200 may check that a data record corresponding to the query 1610 is a compression partition stored in the COMPRESSED DATA field 1626 of the first record of the compression table 1620 in the compression table 1620. Accordingly, the computer device 200 may decompress the corresponding compression partition, and may provide, as the results of the search, data records (data records of "50,000 rows") included in the corresponding compression partition.

FIG. 17 illustrates an example in which archived data is searched for in the compression table 1620 based on a query 1710. In an embodiment of FIG. 17, a key index table 1720 may be used because the query 1710 uses a primary key as a search condition. The key index table 1720 includes a Doc.No. field 1721, an OBJECT ID field 1722, a Key Location Info. field 1723, and a Sub Location Info. field 1724.

The query 1710 may mean an instruction to instruct searching a table "TAB1" and a table "TAB2" for a data record in which a field value of the Doc.No. field 1721 as a primary key is "1." In this case, the computer device 200 may check the first record in which a field value of the Doc.No. field 1721 is "1" in the key index table 1720, and may search the compression table 1620 for data records, each one having a primary key of "1", based on a field value of the Sub Location Info. field 1724 of the first record. For example, the computer device 200 may extract data records, each one having a primary key of "1", from the compression table 1620 based on subindex information "TAB1@1001-2/TAB2@2001-3" of the first record of the key index table 1720 in which a field value of the Doc.No. field 1721 is "1." In this case, data records each having a value of a specific primary key can be searched for easily and rapidly although all data records included in compression partitions are not searched for based on a location included in subindex information.

The aforementioned system or apparatus (or device) may be implemented by a hardware component or a combination of a hardware component and a software component. For example, the device and components described in the embodiments may be implemented using one or more general-purpose computers or special-purpose computers, like a processor, a controller, an arithmetic logic unit (ALU), a digital signal processor, a microcomputer, a field programmable gate array (FPGA), a programmable logic unit (PLU), a microprocessor or any other device capable of executing or responding to an instruction. The processor may perform an operating system (OS) and one or more software applications executed on the OS. Furthermore, the processor may access, store, manipulate, process and generate data in response to the execution of software. For convenience of understanding, one processing device has been illustrated as being used, but a person having ordinary skill in the art may understand that the processor may include a plurality of processing elements and/or a plurality of types of processing elements. For example, the processor may include a plurality of processors or a single processor and a single controller. Furthermore, a different processing configuration, such as a parallel processor, is also possible.

Software may include a computer program, code, an instruction or a combination of one or more of them and may configure a processor so that it operates as desired or may instruct the processor independently or collectively. The software and/or data may be embodied in a machine, component, physical device, virtual equipment or computer storage medium or device of any type in order to be interpreted by the processor or to provide an instruction or data to the processor. The software may be distributed to computer systems connected over a network and may be stored or executed in a distributed manner. The software and data may be stored in one or more computer-readable recording media.

The method according to the embodiment may be implemented in the form of a program instruction executable by various computer means and stored in a computer-readable recording medium. The computer-readable recording medium may include a program instruction, a data file, and a data structure solely or in combination. The medium may continue to store a program executable by a computer or may temporarily store the program for execution or download. Furthermore, the medium may be various recording means or storage means of a form in which one or a plurality of pieces of hardware has been combined. The medium is not limited to a medium directly connected to a computer system, but may be one distributed over a network. An example of the medium may be one configured to store program instructions, including magnetic media such as a hard disk, a floppy disk and a magnetic tape, optical media such as CD-ROM and a DVD, magneto-optical media such as a floptical disk, ROM, RAM, and flash memory. Furthermore, other examples of the medium may include an app store in which apps are distributed, a site in which other various pieces of software are supplied or distributed, and recording media and/or store media managed in a server. Examples of the program instruction may include machine-language code, such as a code written by a compiler, and a high-level language code executable by a computer using an interpreter.

As described above, according to embodiments of the present disclosure, data compressed and stored in the non-volatile storage means can be rapidly searched for by compressing a data record, stored in the volatile in-memory database, in a partition unit, storing the compressed data record in the non-volatile storage means, and storing, in a table of the volatile in-memory database, a storage key to uniquely identify each of partitions stored in the non-volatile storage means and sorting information used to determine a partition for a data record.

As described above, although the embodiments have been described in connection with the limited embodiments and the drawings, those skilled in the art may modify and change the embodiments in various ways from the description. For example, proper results may be achieved although the aforementioned descriptions are performed in order different from that of the described method and/or the aforementioned elements, such as the system, configuration, device, and circuit, are coupled or combined in a form different from that of the described method or replaced or substituted with other elements or equivalents.

Accordingly, other implementations, other embodiments, and the equivalents of the claims belong to the scope of the claims.

What is claimed is:

1. A data processing method performed by a computer device comprising at least one processor, comprising:
   determining, by the at least one processor, a partition for a data record, included in a table of a volatile in-memory database, based on sorting information of the data record;
   generating, by the at least one processor, a compression partition by compressing the data record for each partition;
   associating and storing, by the at least one processor, the compression partition and a storage key to uniquely identify the compression partition in non-volatile storage means;
   associating and storing, by the at least one processor, the storage key and the sorting information in an index table of the volatile in-memory database; and
   associating and storing, by the at least one processor in a key index table, a primary key, key index information which is a location of a corresponding data record in a compression partition compressed to comprise the corresponding data record, and a storage key corresponding to the compression partition compressed to comprise the corresponding data record, with respect to each of data records included in the table,
   wherein storing the primary key, the key index information, and the storage key in the key index table comprises:
   with respect to a second compression partition generated by compressing a data record in a connection table connected to the table through the primary key,
   searching for a data record having a primary key identical with the primary key of the data record included in the table, among data records included in the second compression partition; and
   further storing subindex information, which is a location of the retrieved data record in the second compression partition, in the data record having the same primary key in the key index table,
   wherein the key index information includes:
   a sequence as a serial number of the compression partition containing a first data record corresponding to a first primary key; and
   an order of the first data record in the compressed partition corresponding to the sequence, and
   wherein the subindex information includes:
   identifiers of connection tables connected through a second primary key;
   a first delimiter that separates the identifiers of the connection tables connected through the second primary key;
   ranges of data records identified through second primary key for each of the identifiers; and
   a second delimiter that separates an identifier and a range for the same connection table among the connection tables connected through the second primary key.

2. The method of claim 1, wherein:
the sorting information comprises a given field value of a corresponding data record, and
storing the storage key and the sorting information in the index table comprises associating and storing the storage key and the given field value in a group index table.

3. The method of claim 1, wherein:
the sorting information comprises information on time of a corresponding data record, and
storing the storage key and the sorting information in the index table comprises associating and storing the storage key and the information on time in a period index table.

4. The method of claim 1, further comprising deleting, by the at least one processor, the compressed data record from the table.

5. The method of claim 4, further comprising:
searching, by the at least one processor, the index table for a storage key associated with identification information included in a restoration request in response to the restoration request for the deleted data record;
searching, by the at least one processor, the non-volatile storage means for a compression partition associated with the retrieved storage key;
restoring, by the at least one processor, the deleted data record by decompressing the retrieved compression partition; and
recording, by the at least one processor, the restored data record on the table based on the identification information.

6. The method of claim 1, wherein generating the compression partition comprises generating the compression partition by compressing, into a binary object, a data record included in the determined partition.

7. The method of claim 1, wherein storing the compression partition and the storage key in the non-volatile storage means comprises separately storing the compression partition and the storage key in non-volatile storage means of another computer device connected to the computer device over a network.

8. A computer device comprising:
at least one processor implemented to execute a computer-readable instruction,
wherein the at least one processor is implemented to:
determine a partition for a data record, included in a table of a volatile in-memory database, based on sorting information of the data record;
generate a compression partition by compressing the data record for each partition;
associate and store the compression partition and a storage key to uniquely identify the compression partition in non-volatile storage means;
associate and store the storage key and the sorting information in an index table of the volatile in-memory database; and
associate and store in a key index table, a primary key, key index information which is a location of a corresponding data record in a compression partition compressed to comprise the corresponding data record, and a storage key corresponding to the compression partition compressed to comprise the corresponding data record, with respect to each of data records included in the table,
wherein storing the primary key, the key index information, and the storage key in the key index table comprises:
with respect to a second compression partition generated by compressing a data record in a connection table connected to the table through the primary key,
searching for a data record having a primary key identical with the primary key of the data record included in the table, among data records included in the second compression partition; and
further storing subindex information, which is a location of the retrieved data record in the second compression partition, in the data record having the same primary key in the key index table,
wherein the key index information includes:
a sequence as a serial number of the compression partition containing a first data record corresponding to a first primary key; and
an order of the first data record in the compressed partition corresponding to the sequence, and
wherein the subindex information includes:
identifiers of connection tables connected through a second primary key;
a first delimiter that separates the identifiers of the connection tables connected through the second primary key;
ranges of data records identified through second primary key for each of the identifiers; and
a second delimiter that separates an identifier and a range for the same connection table among the connection tables connected through the second primary key.

9. The computer device of claim 8, wherein:
the sorting information comprises a given field value of a corresponding data record, and
the at least one processor is further implemented to associate and store the storage key and the given field value in a group index table.

10. The computer device of claim 8, wherein:
the sorting information comprises information on time of a corresponding data record, and
the at least one processor is further implemented to associate and store the storage key and the information on time in a period index table.

* * * * *